US010850383B1

(12) United States Patent
    Urban et al.

(10) Patent No.: US 10,850,383 B1
(45) Date of Patent: Dec. 1, 2020

(54) TOOL USER INTERFACE RING

(71) Applicant: Ingersoll-Rand Company, Davidson, NC (US)

(72) Inventors: Jason D. Urban, Kintnersville, PA (US); Jefferey Clifford Yaschur, Doylestown, PA (US)

(73) Assignee: Ingersoll-Rand Industrial U.S., Inc., Davidson, NC (US)

( * ) Notice: Subject to any disclaimer, the term of this patent is extended or adjusted under 35 U.S.C. 154(b) by 0 days.

(21) Appl. No.: 16/555,387

(22) Filed: Aug. 29, 2019

(51) Int. Cl.
| *B25F 5/02* | (2006.01) |
| *H05K 5/00* | (2006.01) |
| *F21V 33/00* | (2006.01) |
| *G05G 1/10* | (2006.01) |
| *H01H 9/18* | (2006.01) |
| *B25F 5/00* | (2006.01) |
| *G01D 5/14* | (2006.01) |
| *G05G 9/047* | (2006.01) |
| *F21Y 115/10* | (2016.01) |
| *H01H 9/16* | (2006.01) |

(52) U.S. Cl.
CPC ............. *B25F 5/02* (2013.01); *F21V 33/0084* (2013.01); *G05G 1/105* (2013.01); *H01H 9/182* (2013.01); *H05K 5/0017* (2013.01); *B25F 5/001* (2013.01); *F21Y 2115/10* (2016.08); *G01D 5/145* (2013.01); *G05G 2009/04748* (2013.01); *H01H 2009/164* (2013.01)

(58) Field of Classification Search
CPC .......... B25F 5/02; B25F 5/001; F21V 33/008; F21V 33/0084; H01H 9/161; H01H 9/181; H01H 9/182; H01H 2009/164; G05G 1/105; G05G 2009/04748; G05G 2009/04755; H05K 5/0017; G01D 5/145
See application file for complete search history.

(56) References Cited

U.S. PATENT DOCUMENTS

| 6,079,401 | A | 6/2000 | Alvord et al. |
| 6,443,675 | B1 | 9/2002 | Kopras et al. |
| 6,471,648 | B1* | 10/2002 | Gamelsky ............... A61B 8/00 600/437 |
| 6,556,222 | B1 | 4/2003 | Narayanaswami |
| 6,667,446 | B1 | 12/2003 | Schuberth et al. |
| 7,182,148 | B1 | 2/2007 | Szieff |
| 7,506,269 | B2 | 3/2009 | Lang |

(Continued)

*Primary Examiner* — Alan B Cariaso
(74) *Attorney, Agent, or Firm* — Taft Stettinius & Hollister LLP

(57) ABSTRACT

A user interface assembly that can be selectively attached to a housing of a tool, including mobile and handheld tools. The assembly can include a housing having an opening that extends through a first side of the housing. A user input device in the form of a rotatable and linearly displaceable control ring, which is housed in the housing, can extend within a portion of the opening such that the control ring is recessed from the first side of the housing. A display that can visually communicate tool information and selectable settings to the user can be positioned within the housing, and centrally located relative to a central bore of the control ring. The display, which can remain relatively static relative to a rotational displacement of the control ring, can be inwardly offset from a first side of the control ring, and thus also recessed within the housing.

20 Claims, 5 Drawing Sheets

(56) References Cited

U.S. PATENT DOCUMENTS

| | | | |
|---|---|---|---|
| 7,918,573 B2* | 4/2011 | Fujiwara | H01H 25/041 |
| | | | 362/23.09 |
| 9,254,499 B2 | 2/2016 | Klicpera | |
| 2005/0001821 A1* | 1/2005 | Low | G06F 3/0362 |
| | | | 345/169 |
| 2007/0228261 A1* | 10/2007 | Kang | H01H 25/041 |
| | | | 250/221 |
| 2008/0023309 A1* | 1/2008 | Montalvo | H01H 19/025 |
| | | | 200/332 |
| 2014/0008088 A1 | 1/2014 | Chellew | |
| 2014/0284070 A1 | 9/2014 | Ng et al. | |
| 2016/0100817 A1* | 4/2016 | Hussain | A61B 7/04 |
| | | | 600/301 |
| 2016/0297060 A1 | 10/2016 | Puzio et al. | |
| 2017/0151657 A1 | 6/2017 | Nagasaka et al. | |
| 2018/0169815 A1 | 6/2018 | Barr | |

* cited by examiner

US 10,850,383 B1

TOOL USER INTERFACE RING

FIELD OF INVENTION

The present invention relates to mobile industrial tools that are controlled by electronics, and more particularly, to a user interface assembly that is attachable to a mobile tool housing, and which provides a rotatable user input.

BACKGROUND

Typical mobile industrial tools that contain electronics are designed to minimize the size and/or weight of the tool. Accordingly, the housings for such tools often do not have excess real estate that can accommodate certain features, including, for example, electronic displays and buttons that may be associated with tool set up and/or other user entry relating to at least parameter control. Additionally, such tools are often operated in relatively harsh environments that would be detrimental to the inclusion of displays and buttons with the tool.

Further, given the nature of at least some job environments, workers using such mobile tools are often wearing gloves or other hand protection. Yet, to accommodate such gloves, and the associated bulk and/or restricted movement or sense of touch, buttons may need to have a larger size to accommodate the limitations that may be associated with wearing gloves. However, such increases in button size may not be feasible given the limited available real estate along the tool housing and/or in view of attempts to minimize tool size and/or weight. Alternatively, such buttons could be designed for use without gloves. Yet, such designs could then cause the worker to incur the time and effort associated with removing the gloves before, and subsequently putting the gloves back on after, each time that the user utilizes the buttons.

Accordingly, although various mobile tools are currently available in the marketplace, further improvements are possible to provide a means for user interfaces and electronic displays for such tools.

BRIEF SUMMARY

An aspect of an embodiment of the present application is a device that includes a housing that extends between a first side and a backside of the housing, the housing having an opening that extends through the first side of the housing. The device can also include a control ring having a first side, a second side, and a central bore. The first side of the control ring can be positioned within the opening, and inwardly offset from the first side of the housing. The central bore can extend through the control ring. Further, the control ring can be rotatably displaceable within the housing. The device can also include a display that can be positioned within the housing and centrally located relative to the central bore of the control ring. The display can be secured to the device to remain relatively static relative to a rotational displacement of the control ring. Additionally, the display can be inwardly offset from the first side of the control ring.

Another aspect of an embodiment of the present application is a device that includes a housing that extends between a first side and a backside of the housing. Further, the housing can have an opening that extends through the first side of the housing. The device can also include a control ring having an interface hub, a light ring, and a central bore. The interface hub can have a first side and a second side. At least a portion of the light ring can extend into the opening, and can be inwardly offset from the first side of the housing. The central bore can extend through the interface hub. Further, the control ring can be rotatably and linearly displaceable within the housing. The device can also include a display that is positioned within the housing and centrally located relative to the central bore of the control ring. The display can be secured to the device to remain relatively static relative to a rotational displacement of the control ring. Additionally, the display can be inwardly offset from the first side of the interface hub. The device can also include a processing device that can be positioned within the housing, and which can be communicatively coupled to the display and the control ring.

Additionally, an aspect of an embodiment of the present application is a device that includes a driver that is housed within a first housing, and a second housing that is selectively attachable to the first housing. The second housing can include a wall that defines an interior region of the second housing. Further, the wall can extend between a first side and a backside of the housing. The housing can also have an opening that extends through the first side of the housing. The device can also include a control ring having a first side, a second side, and a central bore. The first side of the control ring can be positioned within the opening and inwardly offset from the first side of the second housing. The central bore can extend through the control ring. Additionally, the control ring can be rotatably displaceable within the second housing. The device can also include a display that can be positioned within the interior region of the second housing, and centrally located relative to the central bore of the control ring. Further, the display can be secured to the device to remain relatively static relative to a rotational displacement of the control ring. The display can also be inwardly offset from the first side of the control ring. The device can also include a processing device housed within the housing, the processing device being communicatively coupled to the driver, the display, and the control ring.

These and other aspects of the present invention will be better understood in view of the drawings and following detailed description.

BRIEF DESCRIPTION OF THE DRAWINGS

The description herein makes reference to the accompanying figures wherein like reference numerals refer to like parts throughout the several views.

Figure 1:
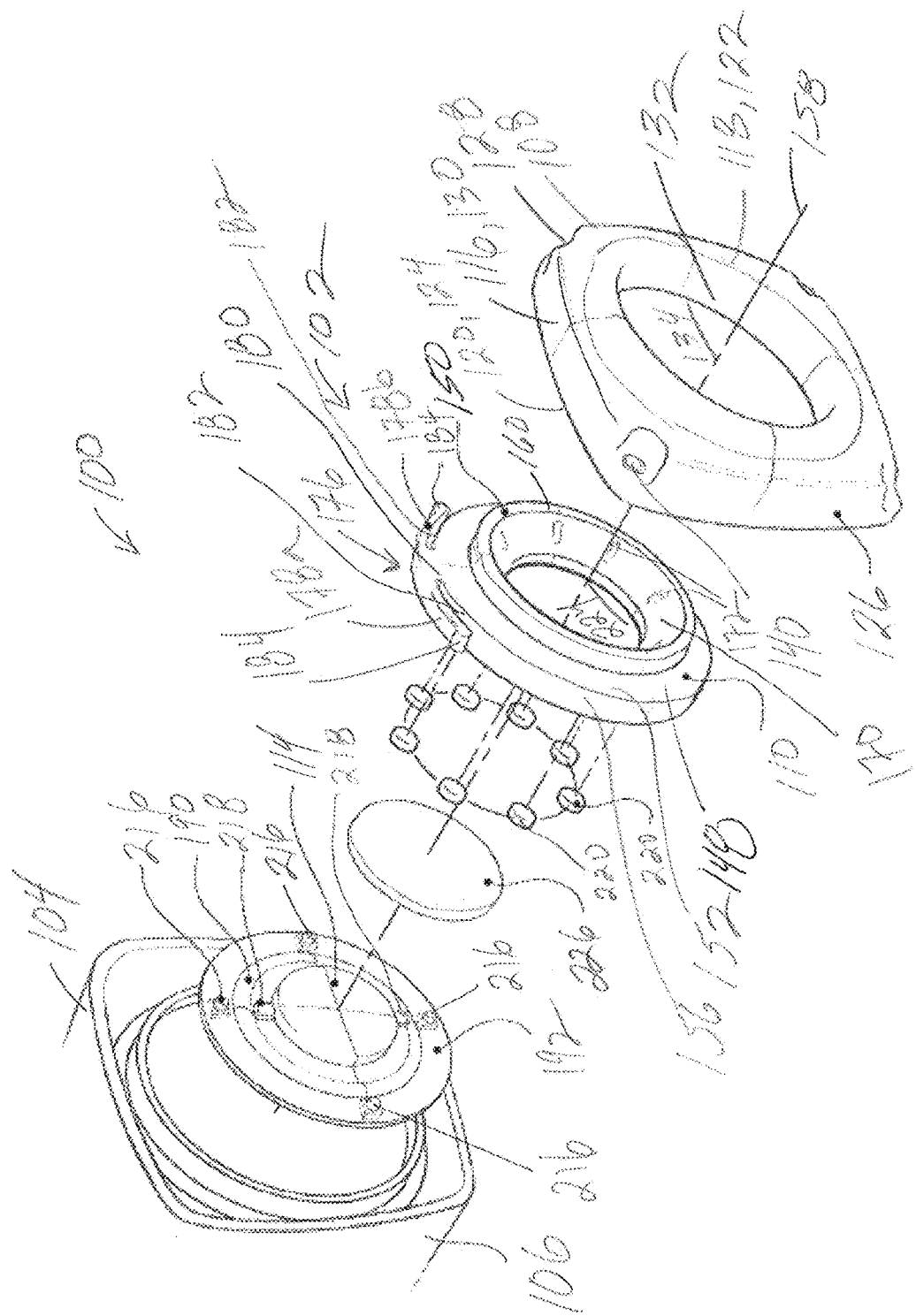
FIG. 1 illustrates an exploded perspective view of a portion of an exemplary industrial tool having a user interface assembly according to an illustrated embodiment of the subject application.

The foregoing summary, as well as the following detailed description of certain embodiments of the present application, will be better understood when read in conjunction with the appended drawings. For the purpose of illustrating the application, there is shown in the drawings, certain embodiments. It should be understood, however, that the present application is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof.

FIG. 1 illustrates an exploded perspective view of a portion of an exemplary industrial tool 100 having a user interface assembly 102 according to an illustrated embodiment of the subject application. The user interface assembly 102 can be used with a variety of industrial tools. For example, according to certain embodiments, the tool 100 can be a handheld electric tool, such as, for example, a mobile or handheld electronic drill, impact wrench, ratchet, grinder, sander, cutting tool, hammer, screwdriver, and riveting tool, among other tools. Further, the user interface assembly 102 can be placed in a variety of locations about the tool 100, including, for example, at or along a rear 104, front, top, side, and/or bottom portion of a housing 106 of the tool 100.

Figure 2:
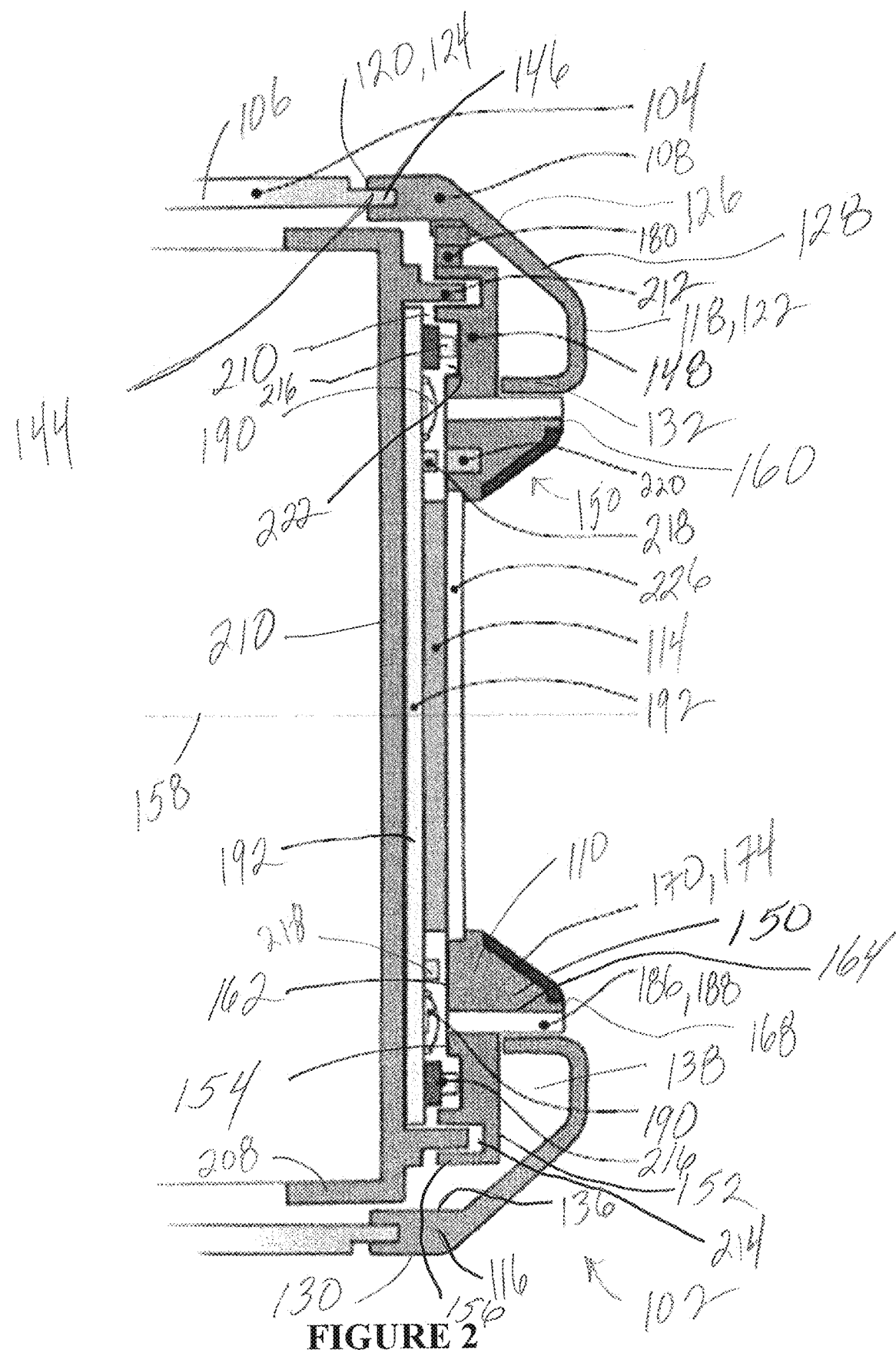
FIG. 2 illustrates a cross-sectional side view of the user interface assembly according to an illustrated embodiment of the subject application.

As shown in FIGS. 1 and 2, according to certain embodiments, the user interface assembly 102 can include a housing 108, a control ring 110, a position sensor 112 (FIG. 3), and a display 114. The housing 108 can have a wall 116 that extends from a front side 118 to a backside 120 of the housing 108. The wall 116 can have a variety of different shapes and sizes, and be constructed from a variety of different materials, including, but not limited to, a thermoplastic or fiber reinforced plastic, as well as a combination thereof, among other materials. The wall 116 can include a front portion 122 at the front side 118 of the housing 108, and a rear portion 124 at the backside 120 of the housing 108. According to certain embodiments, the first portion 128 can be sloped away from the front portion 122, and the second portion 130 can extend from the first portion 128 to the rear portion 124 of the wall 116. Additionally, the second portion 130 of the outer surface 126 can have a size(s) and/or shape(s) that is similar to the size(s) and shape(s) of the generally adjacent portion of the housing 106 of the tool 100 that the housing 108 of the user interface assembly 102 will be mounted or attached.

The wall 116 can also include a flange 132 that extends from the front portion 122 of the wall 116. According to the illustrated embodiment, the flange 132 extends generally inwardly from the front portion 122 and toward the backside 120 of the housing 108. Alternatively, according to other embodiments, the flange 132 can extend in a generally outwardly direction away from both the front side 118 and backside 120 of the housing 108. The flange 132 can generally define an opening 134 of the housing 108, the opening being configured to extend through at least a portion of the housing 108 and to house at least a recessed portion of the control ring 110, as discussed below.

An inner surface 136 of the wall 116 of the housing 108 can generally define an interior region 138 of the housing 108. The interior region 138 can be sized to accommodate placement of at least a portion of components of the user interface assembly 102 within the interior region 138. Additionally, the interior region 138 can be in fluid communication with the opening 134 in the front portion 122 of the wall 116.

The housing 108 can be coupled to the tool 100 in a variety of different manners. For example, referencing FIG. 1, according to certain embodiments, the housing 108 has one or more mounting holes 140 that is/are positioned to align with a corresponding mounting hole(s) of the tool 100. Such mounting holes 140 can each be sized to receive a mechanical fastener 142 (FIG. 4), such as, for example, a screw, bolt, and/or pin, among other fasteners, that can engage mating features of the tool 100 in a manner that can selectively secure the housing 108, and thus the user interface assembly 102, to the tool 100. Additionally, or alternatively, as shown in FIG. 2, the wall 116 of the housing 108 of the user interface assembly 102 and the housing 106 of the tool 100 can be configured to be at least partially attached to each other via a snap fit, press fit, or interference fit, among other fits and connections. For example, as shown in FIG. 2, according to certain embodiments, one of the housing 108 of the user interface assembly 102 and the housing 106 of the tool 100 can include one or ends or projections 144, and the other of the housing 108 of the user interface assembly 102 and the housing 106 of the tool 100 can include one or more mating recesses 146 that can facilitate a relatively secure connection therebetween that can at least assist in retaining an attachment between the housing 108 of the user interface assembly 102 and the housing 106 of the tool 100. Alternatively, according to other embodiments, the one or more ends or projections 144 and mating recesses 146 can be used to assist in positioning the user interface assembly 102 at a predetermined location relative to the rear 104 of the tool 100, such as, for example, in connection with aligning the mounting holes 140 with the tool 100, and/or to at least visually integrate the housing 108 of the user interface assembly 102 into the housing 106 of the tool 100.

Referencing FIGS. 1 and 2, according to the illustrated embodiment, the control ring 110 can include a support plate 148 and an interface hub 150. The control ring 110 can be configured to accommodate relatively easy and, compared to at least some types of adjustment buttons, fast adjustment of settings relating to the operation of the tool 100 while the user is both wearing gloves and holding the tool 100. The support plate 148 can, according to the illustrated embodiment, have opposing first and second sides 152, 154, as well as an outer sidewall 156. According to the illustrated embodiment, the support plate 148 has a generally circular configuration such that the outer sidewall 156 generally extends around an outer circumference of the support plate 148. However, the support plate 148 can have a variety of other configurations. Additionally, the support plate 148 can be sized to at least be partially rotatable within at least a portion of the interior region 138 of the housing 108 of the user interface assembly 102 and about a central axis 158 of the user interface assembly 102.

The interface hub 150 can include first and second sides 160, 162, and can outwardly extend away from the first side 152 of the support plate 148. While the interface hub 150 can have a variety of shapes an configurations, according to the illustrated embodiment, at least the outer portion 164 of the interface hub 150 has a generally round or circular shape, and can be selectively rotated in two directions (as indicated by the "R" direction in FIG. 4) via user interaction about the central axis 158 of the user interface assembly 102.

The interface hub 150 can include a face portion 160 at, or in the general vicinity of, the first side 160 of the interface hub 150. As shown in FIG. 2, according to the illustrated embodiment, the face portion 160 of the interface hub 150 can generally be recessed in the opening 134 of the housing 108 such that the face portion 160 is inwardly offset from the front side 118 of the housing 108. Such recessing of the face portion 160, and thus the control ring 110, relative to the housing 108 can protect the control ring 110 from damage that may be otherwise be related to inadvertent impacts, such as, for example, a dropped tool 100 landing on the user interface assembly 102. However, according to other embodiments, at least a portion of the face portion 160 of the interface hub 150 can protrude out from, or be relatively flush or aligned with, the opening 134 of the housing 108.

In the illustrated embodiment, the face portion 160 of the interface hub 150 includes a first portion 168 and a second portion 170. The first portion 168 can, according to certain embodiments, provide a transition between an outer circumference, or similar surface, of the interface hub 150 and the second portion 170 of the face portion 160. For example, according to certain embodiments, the first portion 168 can be generally orthogonal to the central axis 158 of the user interface assembly 102. The second portion 170 can be configured for user interaction, including when a user is wearing gloves, as well as situations in which the user is not wearing gloves. For example, according to the illustrated embodiment, the second portion 170 is an inwardly sloped surface that extends from the first portion 168 in a direction toward both the central axis 158 and the second side 162 of the interface hub 150. The second portion 170 can further have a length that can accommodate the ability of a user to rotatably displace the interface hub 150, and thus the control ring 110, via interaction of at least a digit(s) of the user while the user is, or is not, wearing a glove with the second portion 170 of the interface hub 150.

As shown in at least FIG. 1, according to certain embodiments, the second portion 170 of the interface hub 150 can include tactile grip features that can assist in maintaining engagement, or gripping, of the digit(s) or glove of the user with the second portion 170 at least as the user rotatably displaces the interface hub 150, and thus rotates the control ring 110. Such surface features can include a plurality of protrusions 172, or, alternatively, recesses, that are spaced along the second portion 170. Further, as the protrusions 172 are positioned on the second portion 170, according to certain embodiments, the protrusions 172 have a generally sloped orientation that is similar to the sloped orientation of the second portion 170.

Additionally, as shown in at least FIG. 2, according to certain embodiments, the second portion 170 can, at least in part, include a grip ring 174 that comprises a material that is attached, such as, for example, over-molded, to the interface hub 150 and which is different than a material of other portions of the control ring 110. For example, while the control ring 110 can generally be constructed from a material such as, for example, a thermoplastic or fiber reinforced plastic, among other materials, the grip ring 174 can be constructed from a material having enhanced gripping, or slip resistant, properties, such as, for example, rubber, including, thermoplastic elastomers, among other materials. As shown in FIG. 2, according to certain embodiments, the grip ring 174 can extend across at least a portion of the second portion 170, and, optionally, also across a portion of the first portion 168 of the face portion 160 of the interface hub 150. Additionally, the above-discussed protrusions 172 can be part of the grip ring 174, and thus formed from the same material as the grip ring 174.

The control ring 110 can also be configured to, when being rotated, provide a user with an indication, via sense or feel, that the control ring 110 is rotating. For example, as shown in FIGS. 1 and 2, according to certain embodiments, the control ring 110 can include at least one detent 176. The detent 176 can be configured to abut against at least the inner surface 136 of the wall 116 of the housing 108 at least as the control ring 110 is rotated via the user manipulating the interface hub 150. According to the illustrated embodiment, the detent 176 can have a first detent arm 178a and a second arm 178b, the first and second detent arms 178a, 178b extending outwardly from a base 180 of the detent 176. The base 180 can extend generally in an outwardly radial direction from the support plate 148. Each of the first and second detent arms 178a, 178b can have generally arc shaped configurations and extend in opposing directions from the base 180 such the first and second detent arms 178a, 178b extend over different portions of the outer circumference of the support plate 148. The first and second detent arms 178a, 178b can be spaced away from the support plate 148 such that a relatively elongated gap 182 is positioned between the first and second detent arms 178a, 178b and the adjacent portion of the support plate 148. The gap 182 for each of the first and second detent arms 178a, 178b can be sized to accommodate a degree of flexing, bending, and/or deformation of the corresponding first or second detent arm 178a, 178b.

Additionally, each of the first and second detent arms 178a, 178b can be configured, such as, for example, have a size and shape, to exert a biasing force against at least the inner surface 136 of the wall 116 of the housing 108. Additionally, an end of each of the first and second detent arms 178a, 178b opposite of the end of the first and second detent arms 178a, 178b that is coupled to the base 180 can include a projection 184 that extends at least in a generally upwardly direction away from the remainder of the first and second detent arms 178a, 178b. According to certain embodiments, the projection 184 can be sized to abut against the inner surface 136 of the wall 116 of the housing 108 so as to provide resistance to at least the rotational displacement of the control ring 110. According to such embodiments, such resistance can be detected by the user as the user displaces the control ring 110. Additionally, according to certain embodiments, at least the portion of the inner surface 136 of the wall 116 of the housing 108 that is contacted by the projection 184 of the detent arms 178a, 178b as the control ring 110 is rotated can have a plurality of raised ridges, serrations, or other surface features that can at least periodically be engaged by, and possibly resist the movement of, the projection 184 and further provide the user with a physical sense of movement, including, for example, snap feedback, of the control ring 110 as the control ring 110 is rotated.

According to certain embodiments, the interface hub 150 and the support plate 148 may, or may not, be part of the same monolithic body. Further, as shown in FIG. 2, according to certain embodiments, at least a portion, if not all, of the support plate 148 may be separated from the interface hub 150 by a light ring 186, such as, for example, a ring-shaped light housing 188. Alternatively, the light ring 186 and the control ring 110 can be configured such that the light housing 188 of the light ring 186 is dispersed around different portions of the control ring 110 and/or the light housing 188 extends around, into, or between, portions of the control ring 110. Additionally, the light housing 188 can comprise a single housing or a plurality of housings that are dispersed in, around, or through the control ring 110.

According to certain embodiments, the light ring 186 can be constructed from a relatively transparent or translucent material, such as, for example a translucent or partially translucent plastic or glass, among other materials. Additionally, the light ring 186 can include one or more light sources 190 that may be at least partially within, or, alternatively, adjacent to the light housing 188. For example, as shown in FIGS. 1 and 2, according to certain embodiments, the light source 190 can be one or more LED lights, among other types of light sources, that can be coupled to an electronic board 192 that is positioned behind the control ring 110 and within at least the housing 108.

According to certain embodiments, the light ring 186 is configured to provide illumination that can ease the ability of the user to, in at least certain circumstances, visually detect at least features of the user interface assembly 102. The light source(s) 190 of the light ring 186 can also be a multicolor light, or contain light sources of different colors, which can be used to at least communicate, when illuminated and based on the illuminated color of the light source 190, different information to the user. Additionally, or optionally, the light ring 186 can be used to convey information to the user via an on/off pattern of illumination of the light ring 186 and/or via a portion, or portions, of the light ring 186 that are, and simultaneously are not, illuminated.

Figure 3:
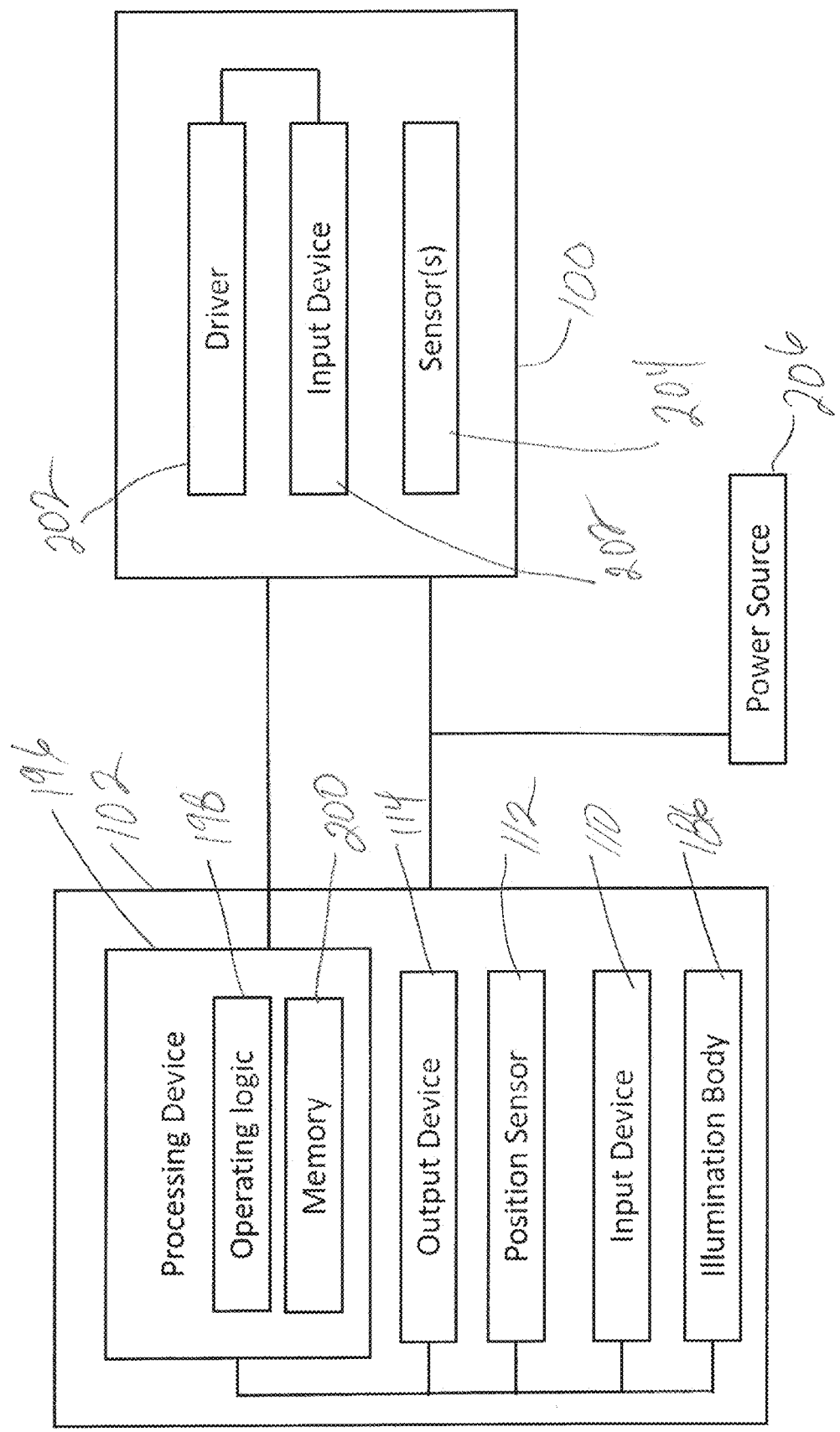
FIG. 3 illustrates a block diagram of an industrial tool having a user interface assembly according to an illustrated embodiment of the subject application.

Referencing FIGS. 2 and 3, according to the illustrated embodiment, the user interface assembly 102 can include a processing device 196. A variety of different types of processing devices may be used for the processing device 196 of the user interface assembly 102, such as, for example, a programmable, dedicated, and/or hardwired state machine, or any combination thereof. The processing device 196 of the user interface assembly 102 can further include multiple processors, such as, for example, Arithmetic-Logic Units (ALUs), Central Processing Units (CPUs), Digital Signal Processors (DSPs), or the like. Processing devices 196 with multiple processing units may also utilize distributed, pipelined, and/or parallel processing. The processing device 196 may also be dedicated to performance of just the operations described herein or may be utilized in one or more additional applications.

In the depicted form, the processing device 196 is of a programmable variety that executes algorithms and processes data in accordance with operating logic 198 as defined by programming instructions (such as software or firmware) stored in the memory 200 of the user interface assembly 102. Alternatively or additionally, the operating logic 198 is at least partially defined by hardwired logic or other hardware. The processing device 196 can include one or more components of any type suitable to process the signals received from an input device, such as, for example, the control ring 110, of the user interface assembly 102, and to provide desired output signals, such as, for example, signals that can provide graphical, numerical, and/or alpha representations, among others, on the display 114 of the user interface assembly 102. Such components may include digital circuitry, analog circuitry, or a combination of both.

The memory 200 can be included with the processing device 196 and/or coupled to the processing device 196. Further, the memory 200 may be of one or more types, such as a solid-state variety, electromagnetic variety, optical variety, or a combination thereof. Additionally, the memory 200 can be volatile, nonvolatile, or a combination thereof, and some or all of the memory 200 can be of a portable variety, such as a disk, tape, memory stick, cartridge, or the like. In addition, according to certain embodiments, the memory 200 can store data that is manipulated by the operating logic 198 of processing device 196, such as data representative of signals received from and/or sent to the control ring 110 and the display 114 in addition to, or in lieu of, storing programming instructions defining the operating logic 198. Further, the memory 200 may or may not be part of the processing device 196.

The processing device 196 can control operation of at least portions of the user interface assembly 102, including, for example, information and menus displayed on the display 114, and the timing, color, and/or degree of illumination of the light source(s) 190 of the light ring 186. Additionally, according to certain embodiments, the processing device 196 can be configured to control at least certain operations of the tool 100 based at least on various parameters and/or settings provided by the manipulation of the one or more input devices, including information selected and/or inputted by the user from operation of at least the control ring 110. The particular parameters and settings controlled by processing device 196 based on the user's selection and input of the selection can vary based on the particular type, and/or functions to be performed by, the tool 100. For example, the user can select and input, via manipulation of at least the control ring 110 and based on information displayed on the display 114, a level or degree of speed and/or torque that is to be outputted by a driver 202, such as, for example, a motor, of the tool 100, and/or a duration or time of operation of the tool 100 or driver 202, among other settings. The processing device 196 can receive from information regarding the manipulation, displacement, and/or positioning of the control ring 110 or other input device, and/or determine from such information the selection(s) that is inputted by the user. Such determination by the processing device 196 can include use of information from the memory 200, as well as use of the operating logic 198. Using such a determination, the processing device 196 can output a signal(s) that is communicated to the driver 202 or other component(s) of the tool 100 that is/are used to control the operation of the tool 100 in a manner that is consistent with the inputted settings or parameters that were selected by the user.

For example, according to certain embodiments and tools 100, in response to an inputted selection made by the user, the processing device 196 can control the level and/or timing of electrical power that is delivered to the driver 202 and/or adjust a clutch setting of the tool 100. According to other embodiments and tools 100, such as, for example, nail guns and related settings regarding selecting nail depth, the processing device 196 can, based on the inputted selection provided by the user via use of the control ring 110, or other inputs of the user interface assembly 102, issue signals to control the associated driver 202, such as, for example, the degree and/or speed of movement of a driving plunger or piston and/or the force that is to be exerted by a spring of the tool 100 to drive the nail into a material.

As shown in FIG. 3, in addition to the driver 202, the processing device 196 can also be communicatively coupled to other components of the tool 100. For example, according to certain embodiments, the processing device 196 can be communicatively coupled to an input device 202 of the tool 100, such as, for example, a trigger and/or power button or switch. Such input devices 202 can, for example, provide the processing device 196 a further indication of when the driver 202 is, and is not, to be operated and/or powered. The processing device 196 can also be coupled to one or more sensors 204. The sensor(s) 204 can provide information regarding the actual operation or state of the tool 100, such as, for example, information indicative of a rotational speed at which a chuck or drill are being driven by the driver 202, among other types of information and sensors. According to certain embodiments, the processing device 196 can utilize information provided by the sensor(s) 204 to adjust, if needed, the output signal(s) communicated from the processing device 196 to the driver 202 or other components of the tool 100 so that the tool 100 operates in a manner that is consistent with the setting(s) or parameter(s) that the user inputted via manipulation of the control ring 110 and/or other input devices of the user interface assembly 102.

While the above examples are discussed in terms of the processing device 196 of the user interface assembly 102 communicating with the driver 202, input device(s) 202, and sensor(s) 204 of the tool 100, according to other embodiments, the processing device 196 may instead communicate to a similar processing device of the tool 100. According to such embodiments, information relating to settings or parameters selected by the user via manipulation of the control ring 110, or other input devices of the user interface assembly 102, may be received by the processing device 196 of the user interface assembly 102, which may then communicate related signals to the processing device of the tool 100. The processing device of the tool 100 may output corresponding signals to the driver 202 or other components of the tool 100. Similarly, information received from the input device(s) 202 and/or sensor(s) 204 of the tool 100 can be communicated from the processing device of the tool 100 to the processing device 196 of the user interface assembly 102. Accordingly, the processing device of the tool 100 may have a similar construction and/or configuration as that discussed above for the processing device 196 of the user interface assembly 102.

As also shown in FIG. 3, the components of the tool 100, as well as the processing device 196 of the user interface assembly 102, may receive a supply of electrical power from a power source 206. The type of power source can vary, and can include, for example, a utility and/or a battery power source, among other power sources. Further, the tool 100 and the processing device 196 may, or may not, share a common power source 206. For example, according to certain embodiments, the user interface assembly 102 may utilize a battery power source 206, while the tool 100 may utilize a utility or different battery power source 206.

According to the illustrate embodiments, the processing device 196 and the memory 200 of the user interface assembly 102 can be attached to an electronic board 192 that is positioned within at least the interior region 138 of the housing 108. According to at least certain embodiments, the electronic board 192 is a printed circuit board (PCB), and thus is constructed from materials that are generally associated with PCBs. The electronic board 192 can be secured to, and/or within, the user interface assembly 102 in a variety of manners. For example, according to certain embodiments, the electronic board 192 can have one or more mounting holes that align with the mounting holes 140 in the housing 108 such that the fasteners 142 that are used to secure the user interface assembly 102 to the tool 100 pass through the mounting holes in the electronic board 192. Alternatively, the electronic board 192 may connected by different mechanical fasteners to the housing 108, among other manners of attaching the electronic board 192 to the housing 108, including, but not limited to, snap-fit connections, among other manners of fastening the electronic board 192 to the housing 108.

Additionally, or optionally, the electronic board 192 can be configured to be received in, and supported by, a back cap 208 (FIG. 2) of the tool 100, such as, for example, a back cap 208 associated with a driver or motor 202 of the tool 100, or alternatively, which is part of the user interface assembly 102. The back cap 208 can be sized to at least partially be positioned in the interior region 138 of the housing 108. Further, according to certain embodiments, the back cap 208 can include an annular ring 212 in the interior region 138 of the housing 108 that can define an inner area 208 of the back cap 208 that can receive placement of at least the electronic board 192, as well as at least some of the components mounted or otherwise attached to the electronic board 192, as well as the display 114. Additionally, a portion of the annular ring 212 can be received in similarly shaped annular recess 214 of the control ring 110 such that the annular ring 212 can at least assist in guiding the rotational displacement of, and/or support, the control ring 110. Additionally, the annular ring 212 can have a length, and the annular recess 214 can have a depth, the can accommodate linear displacement of the control ring 110 in a general direction toward the back cap 208. As discussed below, such linear displacement can be associated with activation of one or more switches 216 of the user interface assembly 102.

The rotational position of the control ring 110, and/or the extent the control ring 110 has been rotated, can be detected by the user interface assembly 102 in a variety of different manners. For example, according to certain embodiments, the user interface assembly 102 can include a position sensor 112, that, as shown by at least FIG. 3, can be in communication with the processing device 196, as well as receive a portion of the power that is provide by the power source 206. A variety of different types of position sensors 112 can be utilized. For example, FIGS. 1 and 2 illustrate an embodiment in which the position sensor 112 is a Hall Effect sensor that comprises one or more sensors 218 and one or more magnets 220. Moreover, in the illustrated embodiment, a sensor(s) 218 for the Hall Effect sensor can be mounted or otherwise coupled to the electronic board 192, and a plurality of magnets 220 can be mounted to the control ring 110. According to such an embodiment, the magnets 220, which can be embedded into, or positioned in a recess within, the control ring 110, among other forms of connection, can rotate with the rotation of the control ring 110. As each magnet 220 is rotated by the sensor 218, the sensor 218 can output a signal that is indicative of the passing of the magnet 220, and thus the movement and/or position of the control ring 110.

The processing device 196 can utilize the signal outputted from the sensor 218 to determine the extent of movement and/or the rotational location of the control ring 110, and correlate that information with a setting being changed and/or selected by the user. The processing device 196 can also be configured to detect the direction of travel of the rotating control ring 110, such as, for example, whether the control ring 110 is being rotated in a first, clockwise direction, or an second, opposite and counter clockwise direction. Thus, for example, the signals outputted by the sensor 218 can be utilized by the processing device 196 to not only detect a position of the control ring 110, but also the direction the control ring 110 is being, or was, rotated in reaching that position and/or location. Such information can be utilized by the processing device 196 to determine, for example, whether the user is increasing or decreasing a particular parameter or setting, among other adjustments, which, again, can be visually communicated to the user via at least the display 114.

Further, the processing device 196 can be configured to send signals to the display 114 of the user interface assembly 102 such that the setting, or changes to the setting, associated with the movement of the control ring 110 can be visually indicated to the user via the display 114. For example, signals outputted by the position sensor 112 that are associated with the passing, or position, of the magnet(s) 220 or other components of the position sensor 112, can be used by the processing device 196 to correlate the movement and/or position of the control ring with a particular speed setting, or adjusted speed setting, for the driver 202, or the associated chuck or drill bit of the tool 100. The display of such information, which can, for example, be numerical and/or graphical, can, according to certain embodiments, be updated as the control ring 110 continues to be rotated, and until such rotation of the control ring 110 ceases. According to certain embodiments, upon reaching a selected speed via rotation of the control ring 110, the user can input the selected speed, such as, for example, via linear displacement of the control ring 110, as discussed below. While the above example is discussed in terms of speed selection, other settings, including torque and time, among other types of selections, can be adjusted in a similar manner. Further, the processing device 196 can also correlate such adjustments or selection of one or more settings with illumination of the light ring 186, such as, for example, illumination of the light ring 186 with a particular color light source(s) 190, activation of only a certain light source(s) 190, and/or a particular on/off illumination pattern of the light source(s) 190.

While the above examples are discussed in terms of a position sensor 112 that is a Hall Effect sensor, a variety of other sensors, including other non-contact sensors, can be utilized. For example, according to certain embodiments, the position sensor 112 can be a pickup type sensor, such as, for example, a capacitive, inductive, optical, or magnetic pickup sensor, as well as a combination thereof, among other types of sensors.

As previously mentioned, according to certain embodiments, the control ring 110 can be both rotatable and generally linearly displaceable about the housing 108 and/or user interface assembly 102. Such linear displacement can be utilized to activate one or more switches 216 of the user interface assembly 102 that are coupled to the electronic board 192. Such switches 216 can be utilized for a variety of functions, including, but not limited to, communicating or inputting to the processing device 196 a setting or other selection that is being selected by the user. As indicated by FIG. 3, the switches 216 can also receive a portion of the electrical power that is provided by the power source 206. Further, the processing device 196 can be configured to determine, from the signals outputted by the switches 216, which particular switch(es) 216 has/have, or has/have not, been activated, which can further assist in determining a selection made by the user.

Additionally, as shown by at least FIG. 2, according to certain embodiments, the second side 154 of the support plate 148 can include an annular recess 222 having a depth that can receive insertion of the switches 216 so as to accommodate rotation of the control ring 110 without prohibiting interference from the switches 216, but which can also accommodate the control ring 110 selectively depressing or activating one or more of the switches 216 when the control ring 110 is linearly displaced in a first direction generally toward the adjacent switch(es) 216. Additionally, according to certain embodiments, the switches 216 can be spring loaded such that, upon release of the user's depressing force on the control ring 110, the spring force of the depressed or activated switch(es) 216 can facilitate linear displacement of the control ring 110 in a second, opposite direction such that the control ring 110 generally returns to the linear position that the control ring 110 had prior to being linearly displaced by the user.

A variety of types of switches can be utilized for the switches 216 of the user interface assembly 102, including, for example, momentary tactile switches, among other types of switches. Further, while the number of switches 216, as well as the arrangement of the switches 216 can vary, according to the embodiment shown in FIG. 1, the user interface assembly 102 can include four switches 216 that are equally spaced around 90 degrees from another, adjacent switch 216. Further, similar to the control ring 110, the switches 216 can be recessed within the interior region 138 of the housing 108. Thus, similar to the control ring 110, the switches 216 can be shielded or protected by the housing 108 of the user interface assembly 102 from at least certain types of forces, including, for example, impact forces associated with the tool 100 being dropped on the user interface assembly 102, and/or the user interface assembly 102 being inadvertently hit.

The linear displacement of the control ring 110 can, according to at least certain embodiments, and/or in certain situations, be generally parallel to the central axis 158 of the housing 108. According to such an embodiment, such linear movement in a direction that is generally parallel to the central axis 158 of the housing 108 can result in the activation of a plurality, if not all, of the switches 216. Additionally, or alternatively, according to certain embodiments, the control ring 110 can be linearly displaced in a direction that is non-parallel to, or angularly offset from, the central axis 158 of the housing 108. Such features can result in the selective activation of only one, or fewer than all, of the switches 216.

For example, with respect to the embodiment shown in FIG. 1, a user linearly depressing only on a top or upper area of the control ring 110 can facilitate the activation of only the switch(es) 216 that is/are positioned directly behind that upper portion of the control ring 110, and without activating at least some of the other switches 216. The ability to accommodate such selective activation of the switches 216 can provide further options to the manner in which selections, as well as the number of available selections, can be inputted by the user of the user interface assembly 102. For example, the ability to activate fewer than all of the switches 216, as well as the ability of the processing device 196 to detect which switch(es) 216 has, or has not, been activated, can accommodate features such as, for example, arrows that can indicate particular courses of action that can be selected by the user. Such arrows can improve the ease with which the user may make certain selections, including, for example, toggling back and forth through different available selections or menus, as well as submenus, that may be visible to the user via the display 114 of the user interface assembly 102.

Thus, according to certain embodiments, upon selecting a setting for the tool 100 via rotation of the control ring 110, which may be visually represented on the display 114, as previously discussed, the user can input or enter that selection via linear displacement of the control ring 110 in a manner that activates, such as, for example, depresses, one or more of the switches 216. According to certain embodiments, such entry of the selected setting, and/or acknowledgment of the entered setting, can be visually communicated to the user in a variety of manners, including, for example, illumination of the light ring 186, illumination of a particular color light source 190, activation of only some of the light source(s) 190, and/or a particular on/off illumination pattern of the light source(s) 190.

The display 114 can be positioned at a generally central location of the user interface assembly 102. For example, according to the illustrated embodiment, at least a portion of the display 114 can be positioned adjacent to a central bore 224 of the control ring 110 such that information displayed on the display 114 is seen through the central bore 224 of the control ring 110. Thus, according to such embodiments, both the central bore 224 of the control ring 110 and the display 114 can be centrally located about the central axis 158 of the user interface assembly 102. Further, according to certain embodiments, the control ring 110 can be rotated about the display 114 such that the position of the display 114 remains fixed and in relatively static position relative to the rotational displacement of the control ring 110. Further, by being positioned behind the control ring 110, the display 114 is also recessed within the interior region 138 of the housing 108. By being recessed, the housing 108 of the user interface assembly 102 can shield the display 114 from at least certain types of impacts, including, for example, impacts relating to the tool 100 being dropped. Additionally, according to certain embodiments, a generally transparent or protective lens 226 for the display 114 can be positioned within the central bore 224 of the control ring 110.

Figure 4:
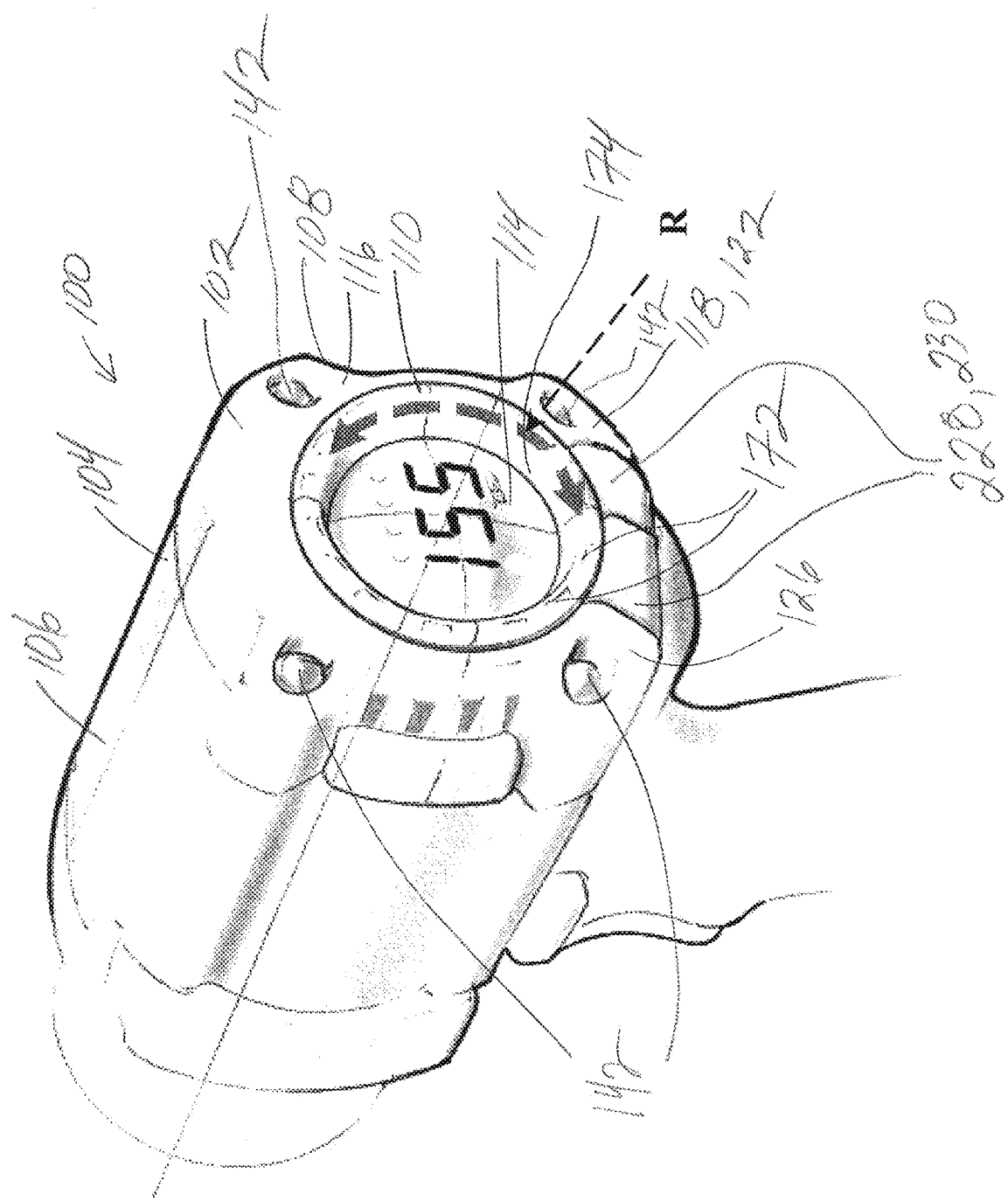
FIG. 4 illustrates a front side perspective view of an exemplary user interface assembly coupled to a rear side of an exemplary industrial tool.

As previously mentioned, the processing device 196 can be configured to output signals that result in graphical, numerical, and/or alpha representations, among others, regarding the tool 100 and settings, among other information, on the display 114, as indicated, for example, by FIG. 4. As previously discussed, a variety of different types of information regarding the tool 100 and/or the operation of settings of the tool 100, as well as associated menus and submenus, can be displayed on the display 114. Thus, a variety of different types of displays can be utilized for the display 114, including, but not limited to, light-emitting diode displays (LED), liquid-crystal displays, or organic light-emitting diode displays (OLED), among other displays. Additionally, the display 114 can be configured to be a graphics display, such as, for example, a dot matrix or pixel display, and/or a segmented alphanumeric character display. Additionally, the display 114 can be a single or multicolor display.

Referencing FIG. 4, according to certain embodiments, the housing 108 can also be configured to house one or more other user inputs, such as, for example, buttons 228. Such buttons 228 can be positioned, and have an outer configuration, that can accommodate engagement by user while the user is wearing gloves. The outer surface 230 of the buttons 228 can be constructed from a variety of materials, including, for example, from the same material as the housing 108 and/or the grip ring 174 of the control ring 110. Further, according to certain embodiments, the outer surface 230 of the buttons 228 can be recessed relative to adjacent portions of the housing 108 so as to at least prevent accidental pressing of the button 228 when the tool 100 and/or user interface assembly 102 is/are placed on a surface.

A variety of different types of buttons can be utilized for the button 228 of the user interface assembly 102, including, but not limited to, a hall switch or sealed switch. Further, similar the switches 216, the buttons 228 can be communicatively coupled to the processing device 196 such that activation of any of the buttons 228, which can occur for example, by depressing the button(s) 228, can be detected by the processing device 196, and the processing device 196 can initiate or execute a corresponding action.

The buttons 228 can be used for a variety of different purposes, including, but not limited to, activating or deactivating the display 114, the powering the tool 100, and/or adjusting a setting of the tool 100, among other operations. Additionally, similar to at least the operation of the control ring 110, the processing device 196 can be also be configured to correlate activation of the button(s) 228 with an activation of the light ring 186, such as, for example, activating a certain color light source(s) 190, activation of only a certain light source(s) 190, and/or activation of the light sources 190 in a particular on/off illumination pattern that may be indicative of a particular setting, action, selection and/or status of for the user interface assembly 102 and/or the tool 100.

Figure 5:
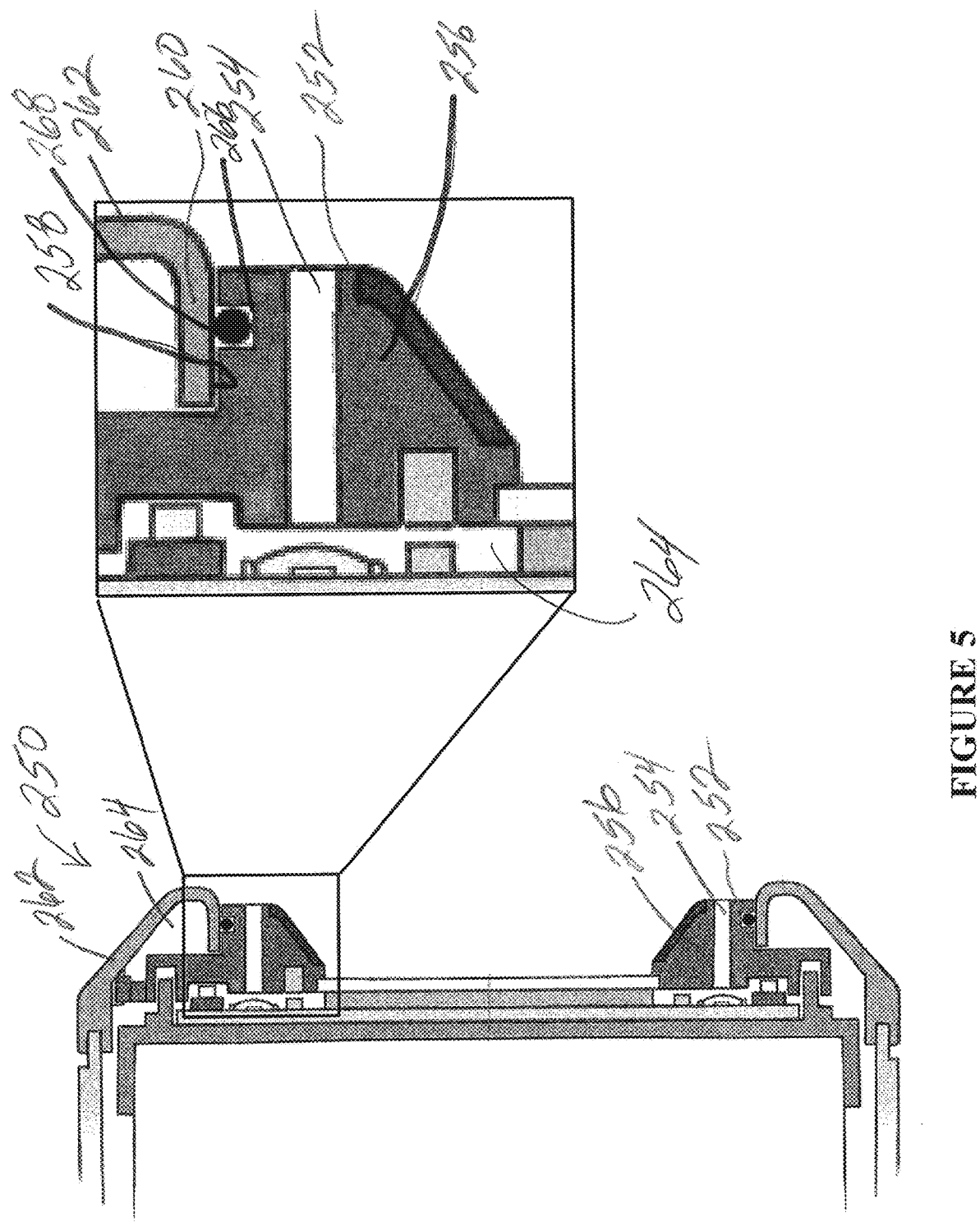
FIG. 5 illustrates a cross-sectional side view, and an enlarged cross section view of a portion thereof, of a user interface assembly according to an illustrated embodiment of the subject application.

FIG. 5 illustrates a cross-sectional side view, and an enlarged cross section view of a portion thereof, of a user interface assembly 250 according to an illustrated embodiment of the subject application. The user interface assembly 250 can be generally similar to the user interface assembly 102 discussed above. However, as seen in FIG. 5, according to certain embodiments, the control ring 252 can be constructed such that at least a portion of the light housing 254 is disposed within at least a portion of the interface hub 256 of the control ring 252. Thus, according to certain embodiments, the interface hub 256 can be radially positioned about opposing sides of the light housing 254. Accordingly, the outer portion 258 of the interface hub 256 can be adjacent to the flange 260 of the housing 262.

Additionally, as also seen in FIG. 5, the user interface assembly 250 can be configured to provide one or more seals 268 that can at least partially protect components of the user interface assembly 102, 250 that may be housed in the interior region 264 of the housing 262 from at least certain environmental elements or conditions that may be external to the user interface assembly 250. For example, according to certain embodiments, the outer portion 258 of the interface hub 256 can include a recess 266 that can house a seal 268, such as, for example, a gasket or O-ring, among other seals, that can at least assist in preventing the ingress of water or other moisture into the interior region 264 of the housing 262. Further, according to certain embodiments, the seal 268 can be sized such that the seal 268 is at least partially compressed and/or deformed between the interface hub 256 and an adjacent portion of the flange 260 of the housing 262 in a manner that can create a barrier that at least attempts to prevent the passage of moisture. Thus, according to certain embodiments, the seal 268 can be constructed from a variety of materials, including, but not limited to, rubber and elastomers, among other materials. Further, the seal 268 can be positioned at a variety of other locations, as well as at least partially housed in other components. For example, with reference to the user interface assembly 102 shown in at least FIG. 1, the recess 266 for the seal 268 can be positioned in at least a portion of the light housing 188. Alternatively, according to other embodiments, one or more recesses 266 and associated seals 268 can be positioned in at least the housing 108, 262, among other locations about the user interface assembly 102, 250.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A device comprising:
   a housing that extends between a first side and a backside of the housing, the housing having an opening that extends through the first side of the housing;
   a control ring having a first side, a second side, and a central bore, the first side of the control ring being positioned within the opening and inwardly offset from the first side of the housing, the central bore extending through the control ring, and wherein the control ring is rotatably displaceable within the housing, the control ring further including at least one detent having a base and at least one detent arm, the base extending radially outwardly relative to an axis of rotation of the control ring, the at least one detent arm extending outwardly from the base to define a portion of a gap between the at least one detent arm and an opposing surface of the control ring, the at least one detent arm positioned to exert a biasing force against an inner surface of the housing as the control ring is rotatably displaced within the housing; and
   a display positioned within the housing and centrally located relative to the central bore of the control ring, the display being secured to the device to remain relatively static relative to a rotational displacement of the control ring, and wherein the display is inwardly offset from the first side of the control ring.

2. The device of claim 1, wherein the control ring further includes a light ring positioned outside of the central bore of the control ring and within at least a portion of the opening of the housing.

3. The device of claim 2, wherein the light ring includes at least one light source and at least one light housing, the light housing being coupled to the control ring.

4. The device of claim 3, wherein the at least one light source is positioned within the housing and behind the at least one light housing and the control ring.

5. The device of claim 1, wherein the control ring is linearly displaceable within the housing, and wherein the device further includes at least one switch that is activatable by linear displacement of the control ring.

6. The device of claim 1, wherein the device includes one or more sensors configured to detect a rotational displacement and/or rotational position of the control ring, at least a portion of the one or more sensors being coupled to the control ring.

7. The device of claim 1, wherein the control ring includes a face portion within the opening of the housing, the face portion having a grip ring, the grip ring constructed from a material having a different degree of slip resistance than another adjacent material of the control ring.

8. The device of claim 1, wherein the display is a graphical, numerical, and/or alpha electronic display.

9. The device of claim 1, further including a tool housing that houses a driver of a tool, and wherein the housing is selectively attachable to the tool housing.

10. A device comprising:
    a housing that extends between a first side and a backside of the housing, the housing having an opening that extends through the first side of the housing;
    a control ring having an interface hub, a light ring, and a central bore, the interface hub having a first side and a second side, the interface hub and at least a portion of the light ring extending into the opening and being inwardly offset from the first side of the housing, the central bore extending through the interface hub, and wherein the control ring is rotatably and linearly displaceable within the housing, the control ring further including a detent having a base, a first detent arm, and a second detent arm, the base extending radially outwardly relative to an axis of rotation of the control ring, the first and second detent arms extending outwardly in opposing directions from the base to each define a portion of a gap between the first and second detent arms and a corresponding opposing surface of the control ring, the first and second detent arms positioned to exert a biasing force against a plurality of raised ridges positioned along an inner surface of the housing as the control ring is rotatably displaced within the housing;
    a display positioned within the housing and centrally located relative to the central bore of the control ring, the display being secured to the device to remain relatively static relative to a rotational displacement of the control ring, and wherein the display is inwardly offset from the first side of the interface hub; and
    a processing device positioned within the housing, the processing device being communicatively coupled to the display and the control ring.

11. The device of claim 10, wherein the device further includes at least one switch that is activatable by linear displacement of the control ring, the at least one switch being communicatively coupled to the processing device.

12. The device of claim 10, further including a tool housing that houses a driver of a tool, and wherein the housing is selectively attachable to the tool housing.

13. The device of claim 10, further including at least one button, the at least one button recessed within a wall of the housing and communicatively coupled to the processing device.

14. The device of claim 10, wherein the device includes one or more sensors configured to detect a rotational displacement and/or rotational position of the control ring, at least a portion of the one or more sensors being coupled to the control ring and communicatively coupled to the processing device.

15. A device comprising:
    a driver housed within a first housing;
    a second housing being selectively attachable to the first housing, the second housing having a wall that defines an interior region of the second housing, the wall extending between a first side and a backside of the second housing, the second housing having an opening that extends through the first side of the first housing;
    a control ring having a first side, a second side, and a central bore, the first side being positioned within the opening and inwardly offset from the first side of the second housing, the central bore extending through the control ring, and wherein the control ring is rotatably displaceable within the second housing;

a display positioned within the interior region of the second housing and centrally located relative to the central bore of the control ring, the display being secured to the device to remain relatively static relative to a rotational displacement of the control ring, and wherein the display is inwardly offset from the first side of the control ring; and a processing device housed within the first housing, the processing device being communicatively coupled to the driver, the display, and the control ring.

16. The device of claim 15, wherein the driver is a motor of a handheld tool.

17. The device of claim 16, wherein the control ring is linearly displaceable within the second housing, and wherein the device further includes at least one switch that is activatable by linear displacement of the control ring, the at least one switch being communicatively coupled to the processing device.

18. The device of claim 17, wherein the control ring further includes a light ring positioned outside of the central bore of the control ring and within at least a portion of the opening of the second housing.

19. The device of claim 18, wherein the device includes one or more sensors configured to detect a rotational displacement and/or rotational position of the control ring, at least a portion of the one or more sensors being coupled to the control ring.

20. The device of claim 19, wherein the control ring includes a face portion within the opening of the second housing, the face portion having a grip ring, the grip ring constructed from a material having a different degree of slip resistance than another adjacent material of the control ring.

\* \* \* \* \*